(12) United States Patent
Huang

(10) Patent No.: US 8,816,721 B2
(45) Date of Patent: Aug. 26, 2014

(54) SYSTEMS AND METHODS FOR OUTPUT CONTROL

(71) Applicant: Fairchild Semiconductor Corporation, San Jose, CA (US)

(72) Inventor: Lei Huang, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/683,321

(22) Filed: Nov. 21, 2012

(65) Prior Publication Data

US 2013/0154709 A1    Jun. 20, 2013

(30) Foreign Application Priority Data

Dec. 15, 2011 (CN) .......................... 2011 1 0429090

(51) Int. Cl.
*H03K 19/094* (2006.01)

(52) U.S. Cl.
USPC .................... 326/86; 326/62; 326/80; 326/82

(58) Field of Classification Search
USPC ......................................... 327/108–112, 333
See application file for complete search history.

(56) References Cited

U.S. PATENT DOCUMENTS

| 6,522,169 B2 * | 2/2003 | Anderson et al. ............... 326/82 |
| 7,692,450 B2 * | 4/2010 | Aranovsky ..................... 326/82 |
| 7,786,759 B2 | 8/2010 | Huang et al. |

FOREIGN PATENT DOCUMENTS

CN    103163802 A    6/2013

* cited by examiner

*Primary Examiner* — Anh Tran
(74) *Attorney, Agent, or Firm* — Schwegman, Lundberg & Woessner, P.A.

(57) ABSTRACT

The present disclosure provides an output control circuit including a signal feedback circuit and an enable control circuit, wherein the signal feedback circuit is configured to compare an output voltage with a set output voltage threshold and to output a disable signal to an enable control circuit when the output voltage arrives at the set output voltage threshold, and wherein the enable control circuit is configured to stop an operation of a translation circuit, upon reception of the disable signal from the signal feedback circuit.

39 Claims, 9 Drawing Sheets

SYSTEMS AND METHODS FOR OUTPUT CONTROL

CLAIM OF PRIORITY

This application claims the benefit of priority under 35 U.S.C. §119(a) of Lei Huang, Chinese Patent Application Number 201110429090.2, entitled "OUTPUT CONTROL CIRCUIT, METHOD AND APPARATUS USING THE SAME," filed on Dec. 15, 2011, which is incorporated by reference herein in its entirety.

TECHNICAL FIELD

This document relates generally to signal interface techniques, and in particular to systems and methods for output control.

BACKGROUND

A bidirectional signal interface allows communication between two or more circuits that generate logic signals having different voltage levels. For example, a processor generates a logic-0 level equal to 0 Volts (V) (a low level) and a logic-1 level equal to 1.8 V (a high level), and a memory generates a logic-0 level equal to 0 V and a logic-1 level equal to 2.7 V. Because the processor and memory logic-1 levels are different, one typically cannot connect the signal (e.g., data address) nodes of the processor directly to the corresponding signal nodes of the memory. Instead, one places a bidirectional signal interface between the processor and memory, and the interface performs a step-up translation of the logic-1 level of the processor to the logic-1 level of the memory, and performs a step-down translation of the logic-1 level of the memory to the logic-1 level of the processor. However, for the existing signal interfaces, as the output edge detection circuit is not disabled, which may cause the high-strength driver at the input to turn on the drive input, a collision may occur with the external signal source at the input (e.g., if the external signal source at the input is changing the signals status thereof), causing large current consumption. Alternatively, the external signal source at the input cannot change the signal status thereof until the high-strength driver at the input is disabled (e.g., completes its outputting operation). The problem with this approach lies in slow transmission rate and high power consumption in a no-signal-translation state.

Overview

In order to better solve the problem of low transmission rate, the present disclosure provides an output control circuit, method and an apparatus using the same, such as a bidirectional signal interface with a multiplexing function is proposed, which is capable of increasing the data transmission rate and reducing power consumption in the no-signal-translation state.

The present disclosure provides an output control circuit, which includes a signal feedback circuit and enable control circuit, wherein the signal feedback circuit is configured to detect an output voltage, to compare the output voltage with a set output voltage threshold, and to output a disable signal to the enable control circuit when the output voltage arrives at the set output voltage threshold, and the enable control circuit is configured to stop an operation of a translation circuit, upon reception of the disable signal from the signal feedback circuit.

The present disclosure also provides an output control method, wherein an output voltage threshold is set, the method includes, when a translation circuit is operating, an output voltage is detected and the output voltage is compared with the set output voltage threshold, and, when the output voltage arrives at the set output voltage threshold, a disable signal is output to stop the operation of the translation circuit.

The present disclosure also provides a translation circuit, which includes an input buffer, a high-strength-drive buffer and an output control circuit, wherein the input buffer provides an input signal to the output control circuit, the output control circuit controls an output signal of the high-strength-drive buffer, the output control circuit includes a signal feedback circuit, an enable control circuit and an edge detector, wherein the edge detector is configured to trigger the signal feedback circuit and the enable control circuit upon detection of the input signal, the signal feedback circuit is configured to detect an output voltage, to compare the output voltage with a set output voltage threshold, and to output a disable signal to the enable control circuit when the output voltage arrives at the set output voltage threshold, the enable control circuit is configured to stop an operation of a translation circuit, upon reception of the disable signal from the signal feedback circuit.

The present disclosure also provides a bidirectional signal interface, which includes two or more output control circuits, each containing a signal feedback circuit and an enable control circuit, wherein the signal feedback circuit is configured to detect an output voltage, to compare the output voltage with a set output voltage threshold of a bidirectional signal interface translation circuit, and to output a disable signal to the enable control circuit when the output voltage arrives at the set output voltage threshold, and the enable control circuit is configured to stop an operation of the translation circuit, upon reception of the disable signal from the signal feedback circuit.

The present disclosure also provides an electronic apparatus including a bidirectional signal interface, which includes two or more output control circuits, each containing a signal feedback circuit and an enable control circuit, wherein the signal feedback circuit is configured to detect an output voltage, to compare the output voltage with a set output voltage threshold of a bidirectional signal interface translation circuit, and to output a disable signal to the enable control circuit when the output voltage arrives at the set output voltage threshold, and the enable control circuit is configured to stop an operation of the translation circuit, upon reception of the disable signal from the signal feedback circuit.

According to the output control circuit, method and apparatus using the same provided by the present disclosure, an output voltage threshold is set, when a translation circuit is operating, an output voltage is detected, and the output voltage is compared with the set output voltage threshold, and an enable/disable signal for the translation circuit is output according to the comparison. In this way, the output voltage of the bidirectional signal interface may be controlled, based on the magnitude of the capacitive load at the output, such that the translated voltage arrives at the desired value, thereby increasing the data transmission rate and satisfying the requirement of the users.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
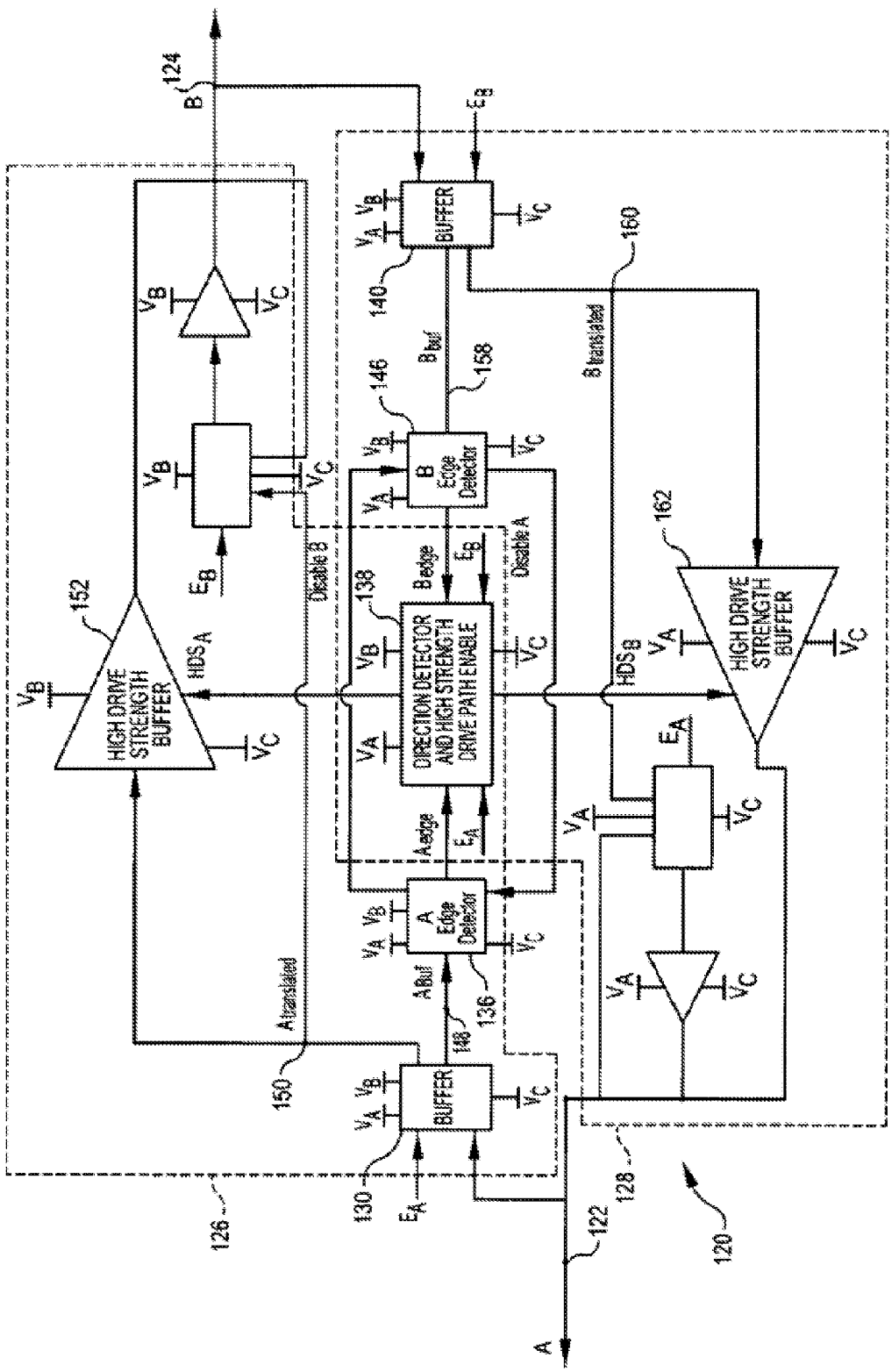
FIG. 1 is a schematic view of the structure of a bidirectional signal interface in the prior art.

U.S. Pat. No. 7,786,759 provides a bidirectional signal interface. As shown in FIG. 1, there are two input/output nodes A and B in the bidirectional interface, the logic-1 level of the node A is $V_A$, the logic-0 level of the node A is $V_C$, the logic-1 level of the node B is $V_B$ and the logic-0 level of the node B is $V_C$, wherein $V_A<V_B$. When the logic-1 level of the node A has to be translated to the logic-1 level of the node B, the input signal at the node A is translated to a corresponding signal $A_{buf}$ at the node 148 through the input buffer 130 of the step-up translator 126, and is translated to a corresponding signal $A_{translated}$ at the node 150, wherein the signal $A_{buf}$ is at the logic-1 level of the node A and the signal $A_{translated}$ is at the logic-1 level of the node B. The A edge detector 136 receives the signal $A_{buf}$ and then sends a signal $A_{edge}$ to the direction detector and the high-strength-drive path enable circuit (DDHSDPE) 138, which sends a high-drive-strength enable signal $HDS_A$ to the high-drive-strength buffer 152. In the duration of the signal $HDS_A$, the high-drive-strength buffer 152 translates, via a relatively high drive strength, the signal $A_{translated}$ to the logic-1 level of the node B, and then drives the signal to the node 124. In this way, the logic-1 level of the node A is translated to the logic-1 level of the node B. On the contrary, when the logic-1 level of the node B has to be translated to the logic-1 level of the node A, the input signal of the node B is translated to a corresponding signal $B_{buf}$ at the node 158 through the input buffer 140 of the step-down translator 128, and is translated to a corresponding signal $B_{translated}$ at the node 160, wherein the signal $B_{buf}$ is at the logic-1 level of the node B and the signal $B_{translated}$ is at the logic-1 level of the node A. The B edge detector 146 receives the signal $B_{buf}$ and then sends a signal $B_{edge}$ to DDHSDPE 138, which sends a high-drive-strength enable signal $HDS_B$ to the high-drive-strength buffer 162. In the duration of the signal $HDS_B$, the high-drive-strength buffer 162 translates, via a relatively high drive strength, the signal $B_{translated}$ to the logic-1 level of the node A, and then drives the signal to the node 122. In this way, the logic-1 level of the node B is translated to the logic-1 level of the node A.

The present application is proposed in view of the above patent document. The basic concept of the present disclosure is that, an output voltage threshold is set, when a translation circuit is operating, an output voltage is detected and the output voltage is compared with the set output voltage threshold, and when the output voltage arrives at the set output voltage threshold, a disable signal is output to stop the operation of the translation circuit.

The present disclosure will be described in detail with reference to the drawings and specific embodiments below.

Figure 2:
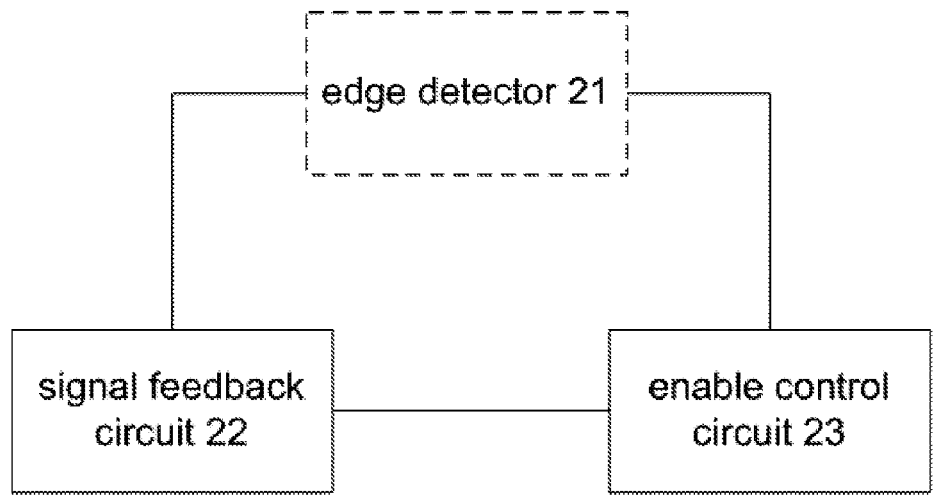
FIG. 2 is a schematic view of the structure of an output control circuit according to the present disclosure.

The present disclosure provides an output control circuit. As shown in FIG. 2, the output control circuit includes a signal feedback circuit 22 and an enable control circuit 23.

The signal feedback circuit 22 is configured to detect an output voltage, to compare the output voltage with a set output voltage threshold, and to output a disable signal to the enable control circuit 23 when the output voltage arrives at the set output voltage threshold.

When the output control circuit is used in the bidirectional signal interface, the set output voltage threshold is equal to the output voltage threshold of the bidirectional signal interface translation circuit.

The enable control circuit 23 is configured to stop an operation of a translation circuit, upon reception of the disable signal from the signal feedback circuit 22.

The output control circuit may further include an edge detector 21, configured to trigger the signal feedback circuit 22 and the enable control circuit 23 upon detection of an input signal.

Figure 3:
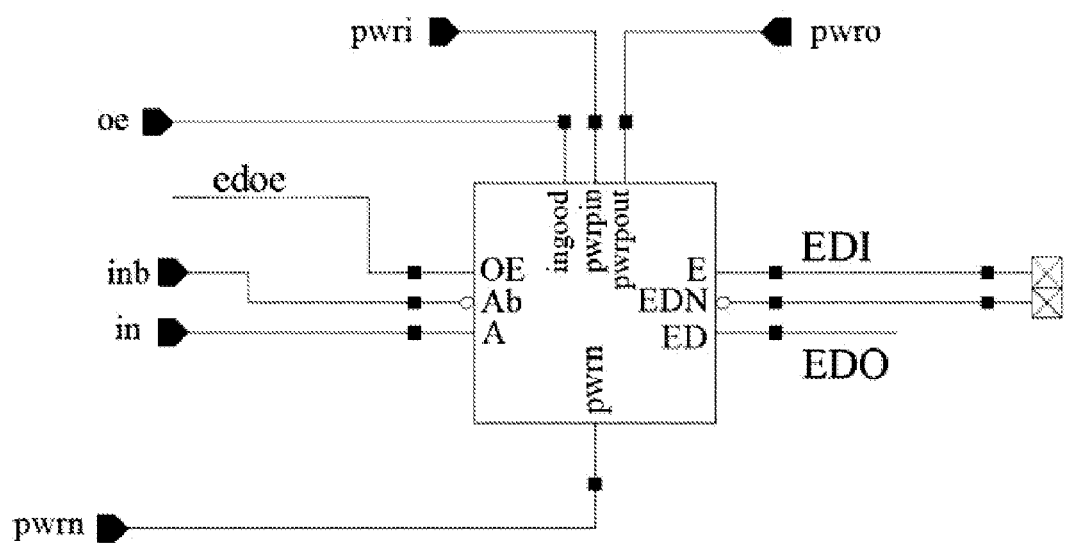
FIG. 3 is a schematic view showing coupling of an edge detector according to the present disclosure.

As shown in FIG. 3, in the edge detector 21, the input signal in is coupled to the input pin A, the inverting input signal inb is coupled to the inverting input pin Ab, the unidirectional operation signal edoe is coupled to the enable pin OE, the input goodness signal oe is coupled to the input goodness pin ingood, the input power node pwri is coupled to the input power pin pwrpin, the common ground node pwrn is coupled to the common ground pin pwrn, the output power pin pwrpout is coupled to the output power node pwro. When all of the input signal in, the inverting input signal inb, the input goodness signal oe, the unidirectional operation signal edoe, the input power node pwri, the common power node pwrn meet the operation requirements, an input enable signal (EDI) is transmitted via the pin E and an output enable signal (EDO) is transmitted via the pin ED.

Figure 4:
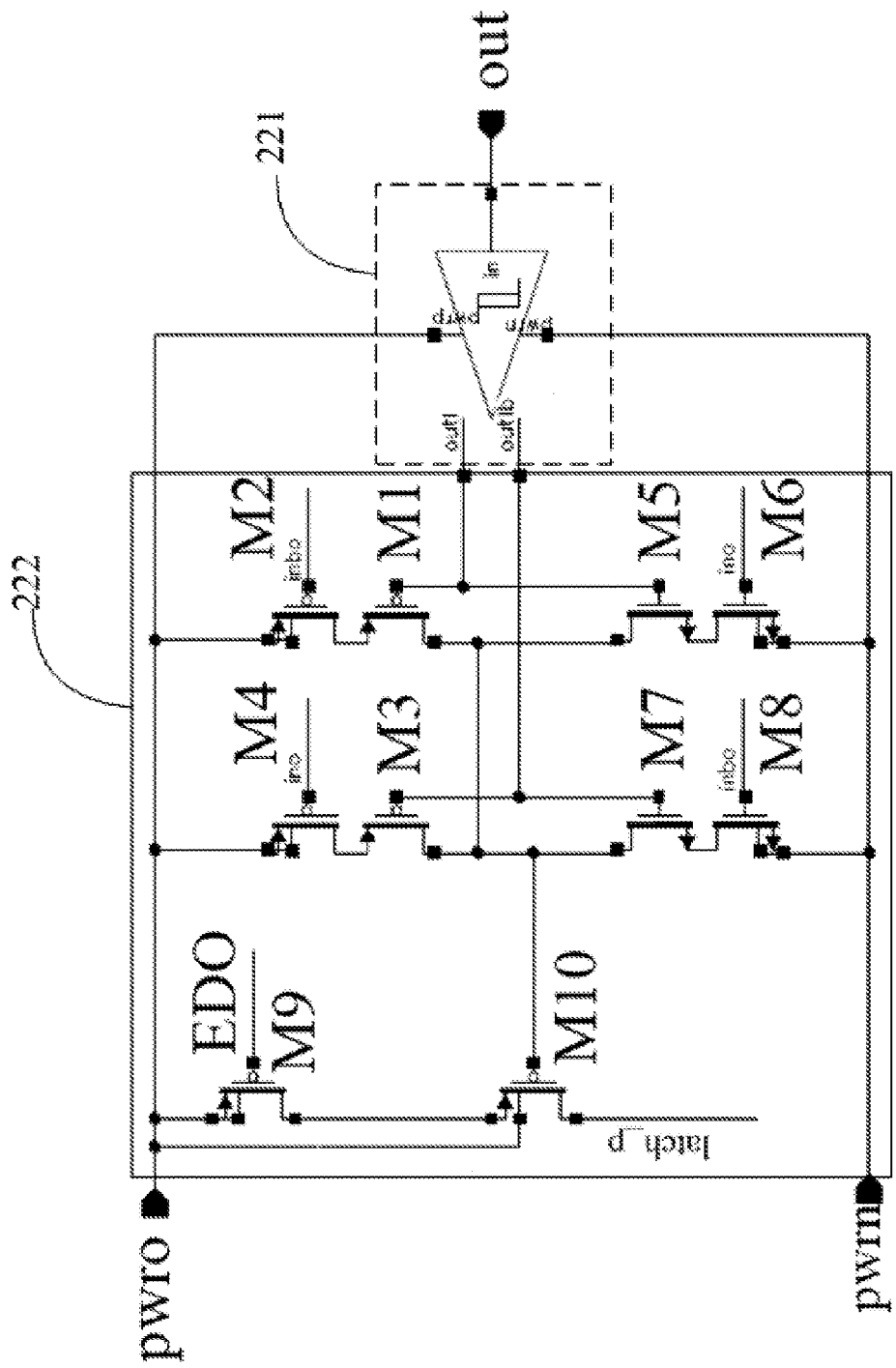
FIG. 4 is a diagram showing a signal feedback circuit according to the present disclosure.

As shown in FIG. 4, the signal feedback circuit 22 specifically includes a threshold detection circuit 221 and a disable signal generation circuit 222, wherein the threshold detection circuit 221 is configured to detect an output voltage, to compare the output voltage with a set output voltage threshold, and to output a trigger signal to the disable signal generation circuit when the output voltage arrives at the output voltage threshold.

As shown in FIG. 4, a Schmitt input buffer may be used as the threshold detection circuit 221. The input pin (in) of the Schmitt input buffer is coupled to the output (out), the output pin (out1) and the inverting output pin (out1b) are coupled to the disable signal generation circuit 222, the output power node is pwro and the common ground node is pwrn. In the Schmitt input buffer, the high voltage threshold is set as ViH and/or the low voltage threshold is set as ViL. When the output voltage at the output arrives at ViH, a high level is output at the out1, and a low level is output at the out1*b*. Alternatively, when the output voltage at the output arrives at ViL, a low level is output at the out1, and a high level is output at the out1*b*.

Figure 5:
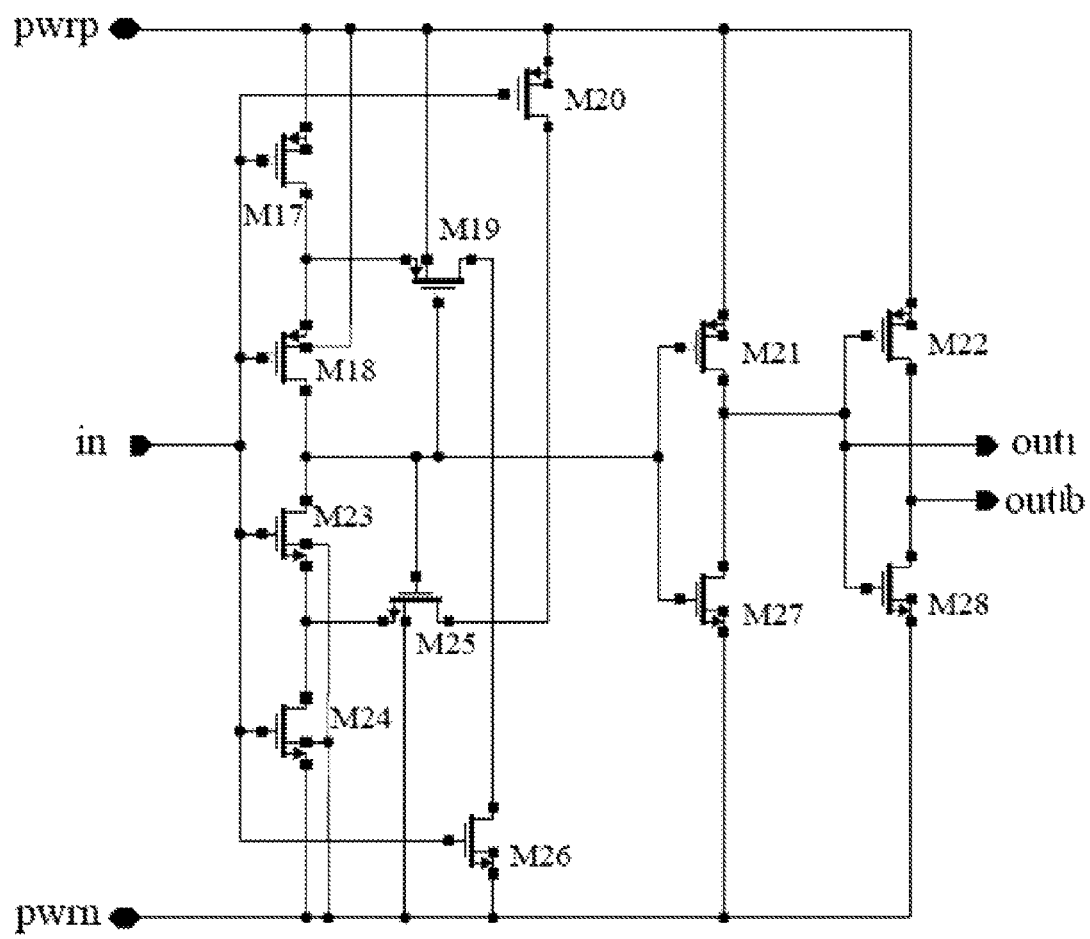
FIG. 5 is a diagram showing the internal logic circuit of a Schmitt input buffer.

The internal logic circuit of the Schmitt input buffer is shown in FIG. 5, in which the output power node is shown as pwro and the common ground node is shown as pwrn. When the output voltage at the output arrives at ViH, i.e., the set high voltage threshold, the high level occurs at the in. At this time, the P-channel metal oxide semiconductor field transistor (PMOS) M17, PMOS M18, PMOS M20, PMOS M22 and the N-channel metal oxide semiconductor field transistor (NMOS) M25 and NMOS M27 are turned off, and the PMOS M19, PMOS M21, NMOS M23, NMOS M24, NMOS M26, NMOS M28 are turned on, such that the high level is output at the out1 and the low level is output at the out1*b*.

When the output voltage at the output arrives at ViL, i.e., the set low voltage threshold, the low level occurs at the in. At this time, the PMOS M17, PMOS M18, PMOS M20, PMOS M22 and the NMOS M25 and NMOS M27 are turned on, and the PMOS M19, PMOS M21, NMOS M23, NMOS M24, NMOS M26, NMOS M28 are turned off, such that the low level is output at the out1 and the high level is output at the out1*b*.

The disable signal generation circuit 222 is configured to output a disable signal to the enable control circuit 23 upon reception of the trigger signal from the threshold detection circuit 221.

As shown in FIG. 4, in the disable signal generation circuit 222, an exclusive or (XOR) logic control circuit is used to control the generation of the disable signal. Specifically, when the out1 is at the high level and the out1*b* is at the low level, the NMOS M5 and the NMOS M6 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. When the out1 is at the low level and the out1*b* is at the high level, the NMOS M7 and the NMOS M8 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. Here, the gates of the PMOS M4 and NMOS M6 are coupled to the input signal (ino) at the output and the levels of the gates are identical to that at the out1. The gates of the PMOS M2 and NMOS M8 are coupled to the inverting input signal (inbo) at the output and the levels of the gates are identical to that at the out1*b*. The gate voltage of the PMOS M9 is EDO, which is at the high level in operation, such that the PMOS M9 is turned off.

The connection relations of the individual devices in the disable signal generation circuit 222 are described as follows. The gates of the PMOS M1 and MMOS M5 are coupled to the out1 of the threshold detection circuit 221. The gates of the PMOS M3 and MMOS M7 are coupled to the out1*b* of the threshold detection circuit 221. The source of the PMOS M1 is coupled to the drain of the PMOS M2. The drain of the PMOS M1 is coupled to the drains of the PMOS M3 and NMOS M5. The gate of the PMOS M2 is coupled to the inbo. The source of the PMOS M2 is coupled to the output power node pwro. The source of the PMOS M3 is coupled to the drain of the PMOS M4. The drain of the PMOS M3 is coupled to the drain of the NMOS M7. The gate of the PMOS M4 is coupled to the ino. The source of the PMOS M4 is coupled to the output power node pwro. The source of the NMOS M5 is coupled to the drain of the NMOS M6. The gate of the NMOS M6 is coupled to the ino. The source of the NMOS M6 is coupled to the common ground node pwrn. The source of the NMOS M7 is coupled to the drain of the NMOS M8. The gate of the NMOS M8 is coupled to the inbo. The source of the NMOS M8 is coupled to the common ground node pwrn. The gate of the PMOS M9 is coupled to the EDO. The source of the PMOS M9 is coupled to the common ground node pwrn. The drain of the PMOS M9 is coupled to the source of the PMOS M10. The gate of the PMOS M10 is coupled to the drains of the PMOS M3 and NMOS M7. The drain of the PMOS M10 forms the node latch_P for transmitting the disable signal.

The enable control circuit 23 is specifically configured to stop outputting the enable signal to the high-drive-strength buffer based on the disable signal, in order to disable the high-drive-strength buffer, where the high-drive-strength buffer is a buffer having a strong drive capability and is configured to output a drive signal upon reception of the enable signal, such that the output voltage at the output arrives at a desired voltage value of the logic level, and to stop outputting the drive signal upon reception of the disable signal.

In practice, the signal feedback circuit 22 may be implemented as a comparator. In this case, the signal feedback circuit 22 may be implemented as a high voltage signal feedback circuit and a low voltage signal feedback circuit.

The high voltage signal feedback circuit is configured to detect an output voltage, to compare the output voltage with a set output voltage threshold, and to output a disable signal to the enable control circuit 23 when the output voltage arrives at a set high voltage threshold.

The low voltage signal feedback circuit is configured to detect an output voltage, to compare the output voltage with a set output voltage threshold, and to output a disable signal to the enable control circuit 23 when the output voltage arrives at a set low voltage threshold.

Figures 6, 7:
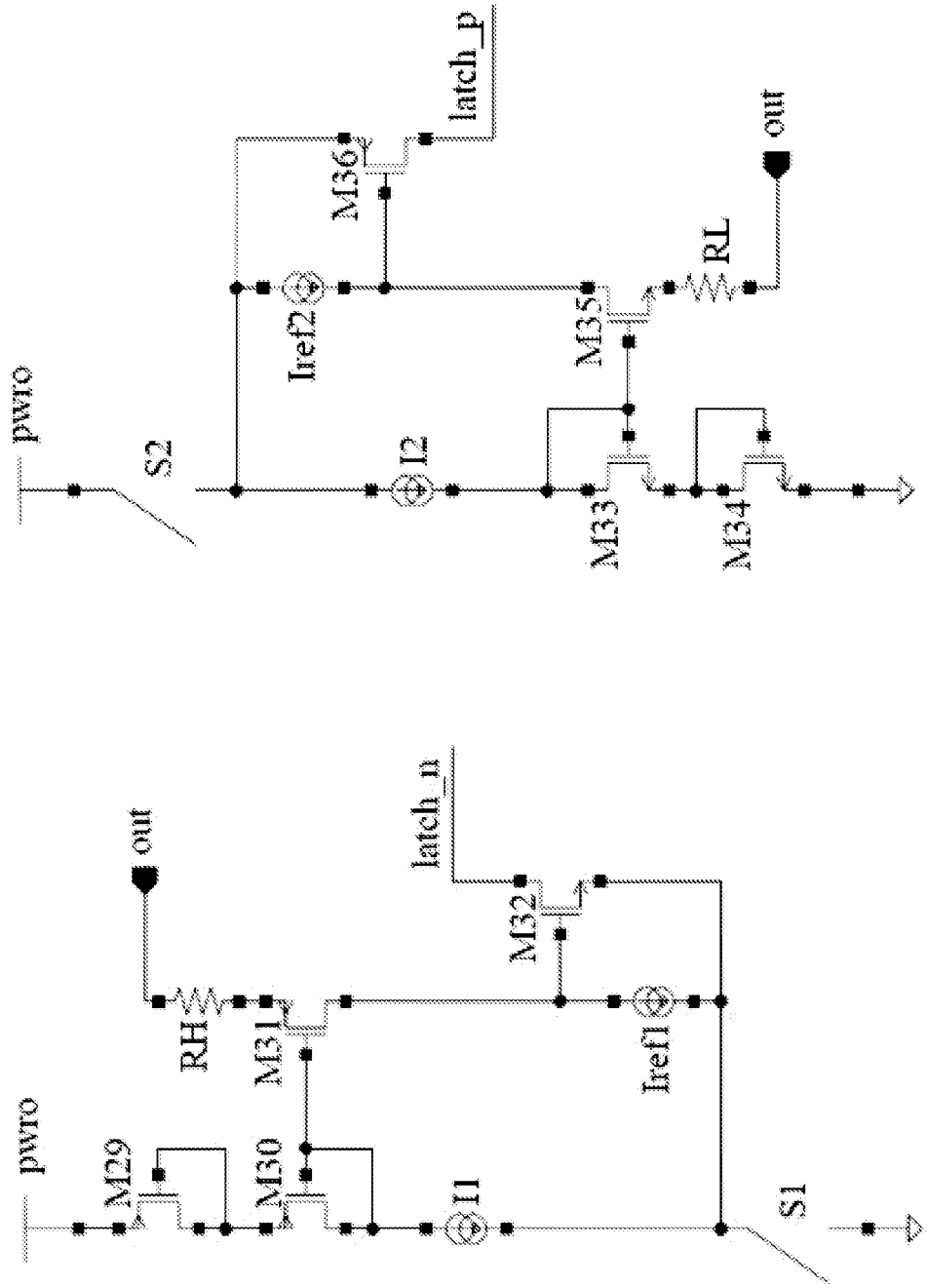
FIG. 6 is a diagram showing the internal structure of a high-voltage signal feedback circuit according to the present disclosure.
FIG. 7 is a diagram showing the internal structure of a low-voltage signal feedback circuit according to the present disclosure.

The internal structure of the high voltage signal feedback circuit is shown in FIG. 6, in which the output power node pwro is coupled to the source of the PMOS M29. When the enable control circuit 23 outputs an enable signal (enable), and the input signal at the input is high, the switch S1 is turned on, and the high voltage signal feedback circuit begins to operate. When the voltage at the output out arrives at ViH, the NMOS M32 is turned on, which further sets the voltage of the node latch_n to be low, such that a disable signal which indicates the low voltage of the node latch_n, is transmitted to the enable control circuit 23. ViH=ViH_REF+Iref 1*RH, where ViH_REF indicates the voltage value of the node coupled to the gate and drain of the PMOS 29 and the source of the PMOS 30, Iref 1 indicates the current value of the first reference current source Iref1 and RH indicates the resistance of the resistor at the source of the PMOS M31.

The low voltage signal feedback circuit is shown in FIG. 7, in which the output power node pwro is coupled to the switch S2. When the enable control circuit 23 outputs an enable signal (enable), and the input signal at the input is low, the switch S2 is turned on, and the low voltage signal feedback circuit begins to operate. When the voltage at the output arrives at ViL, the PMOS M36 is turned on, which further sets the voltage of the node latch_p to be high, such that a disable signal which indicates the high voltage of the node latch_p, is transmitted to the enable control circuit 23. ViL=ViL_REF− Iref 2*RL, where ViL_REF indicates the voltage value of the node coupled to the source of the NMOS 33 and the gate and the drain of the NMOS 34, Iref 2 indicates the current value of the second reference current source Iref 2 and RL indicates the resistance of the resistor at the source of the NMOS M35.

Figure 8:
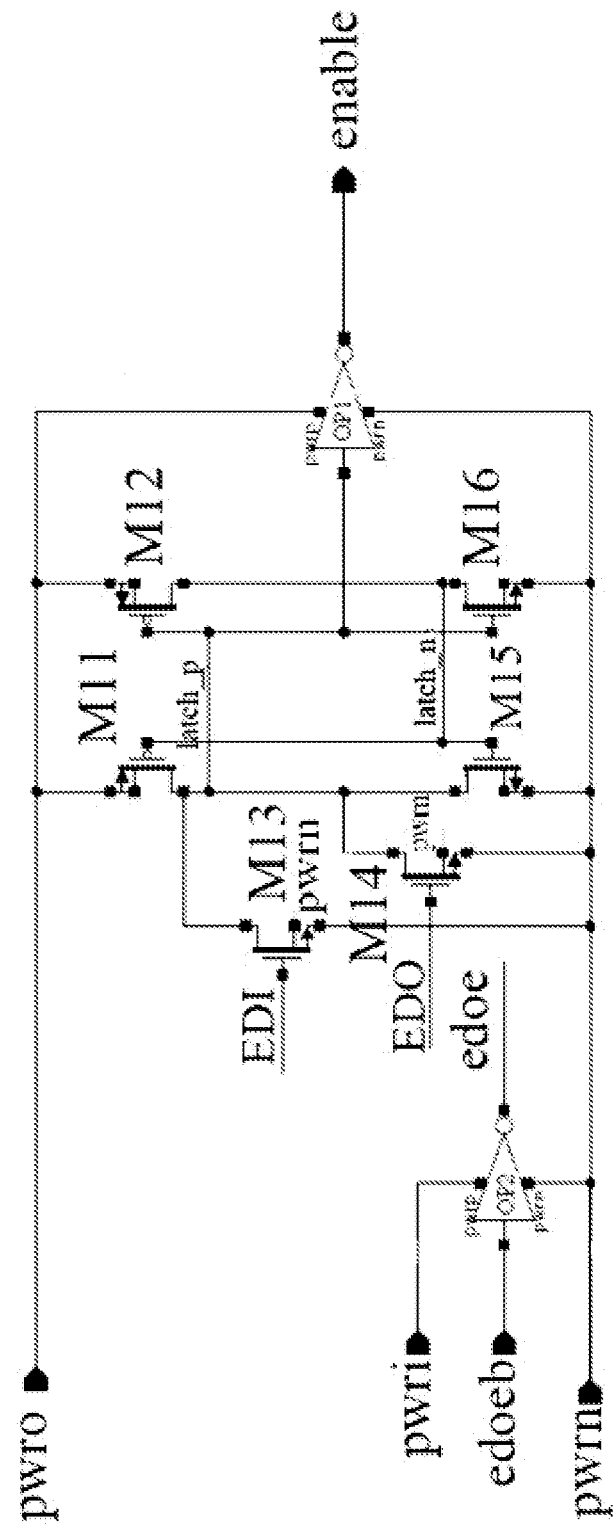
FIG. 8 is a diagram showing an enable control circuit according to the present disclosure.

As shown in FIG. 8, when the enable control circuit 23 is operating, the EDO turns on the NMOS M14, and sets the voltage of the node latch_p to be low, the inverter OP1 outputs an enable signal (enable), which corresponds to the $HDS_A$ or $HDS_B$ signal generated at the bidirectional signal interface as shown in FIG. 1. When the disable signal generation circuit 222 or the low voltage signal feedback circuit sets the voltage of the node latch_p to be high, or the high voltage signal feedback circuit set the voltage of the node latch_n to be low, causing the PMOS M11 to be turned on, such that the voltage of the node latch_p is set to be high, the inverter OP1 is inversed to stop outputting the enable signal, which corresponds to stop outputting the $HDS_A$ or $HDS_B$ signal generated at the bidirectional signal interface as shown in FIG. 1, thus disabling the high-drive-strength buffer to output signals.

In FIG. 8, the PMOS M11, PMOS M12, NMOS M15 and NMOS M16 forms a latch, the output power node is shown as pwro, the common ground node is shown as pwrn and the input power node is shown as pwri.

The connection relations of the individual devices in the enable control circuit 23 are described as follows. The gate of the PMOS M11 is coupled to the gate of the NMOS M15. The source of the PMOS M11 is coupled to the output power node pwro. The drain of the PMOS M11 is coupled to the node latch_P in the signal feedback circuit 22, the drain of the NMOS M14 and the drain of the NMOS M15. The gate of the PMOS M12 is coupled to the gate of the NMOS M16, the node latch_P in the signal feedback circuit 22 and the input of the inverter OP1. The source of the PMOS M12 is coupled to the output power node pwro. The drain of the PMOS M12 is coupled to the gate of the NMOS M15 and the drain of the NMOS M16. The gate of the NMOS M14 is coupled to the EDO. The source of the NMOS M14 is coupled to the common ground node pwrn. The source of the NMOS M15 is coupled to the common ground node pwrn. The gate of the NMOS M16 is coupled to the input of the inverter OP1. The source of the NMOS M16 is coupled to the common ground node pwrn.

The enable control circuit 23 is further configured to set the voltage of the node latch_p to be low through the EDI, such that the inverter OP1 outputs the enable signal to the high-drive-strength buffer. In this way, the operation delay for the translation circuit may be reduced. As shown in FIG. 8, the EDI occurs as long as there is an input signal. The EDI turns on the NMOS M13 and sets the voltage of the node latch_p to be low in a shortest period.

The enable control circuit 23 is further configured to output a unidirectional operation signal to the edge detector 21 upon detecting that the translation circuit is operating unidirectionally. As shown in FIG. 8, assuming that the unidirectional operation signal edoe of the high level indicates that the reversed translation circuit is not operating, when the signal edoeb is at the low level in the case that the inversed translation circuit is not operating, the unidirectional operation signal edoe of the high level may be obtained via the inverter OP2. The edge detector triggers the signal feedback circuit and the enable control circuit when the edoe is at the high level.

Figure 9:
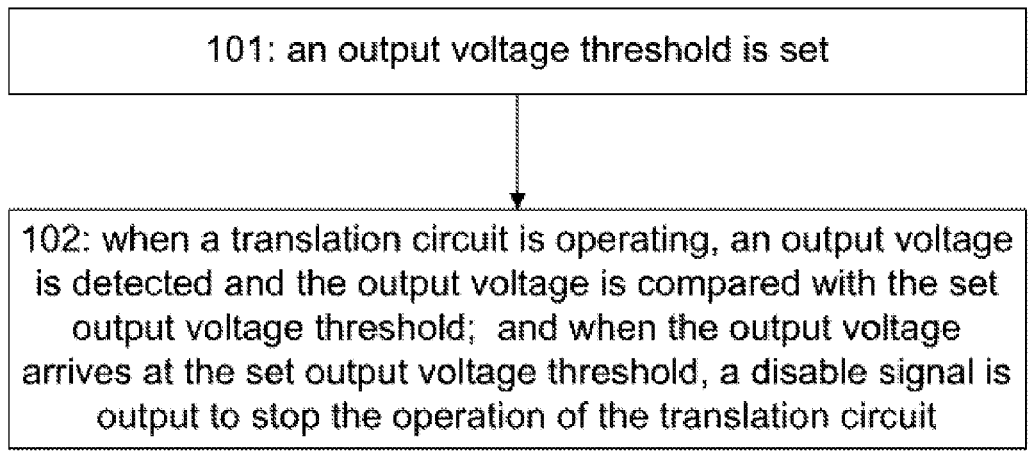
FIG. 9 is a flow chart showing a first output control method according to the present disclosure.

Based on the output control circuit as described above, the present disclosure also provides an output control method. As shown in FIG. 9, the method includes the following steps:

Step 101: an output voltage threshold is set.

Specifically, an output voltage threshold for the bidirectional signal interface translation circuit is set for triggering generation of a disable signal. The output voltage threshold contains at least one of a high voltage threshold and a low voltage threshold.

Step 102: when a translation circuit is operating, an output voltage is detected and the output voltage is compared with the set output voltage threshold, and when the output voltage arrives at the set output voltage threshold, a disable signal is output to stop the operation of the translation circuit.

Figure 10:
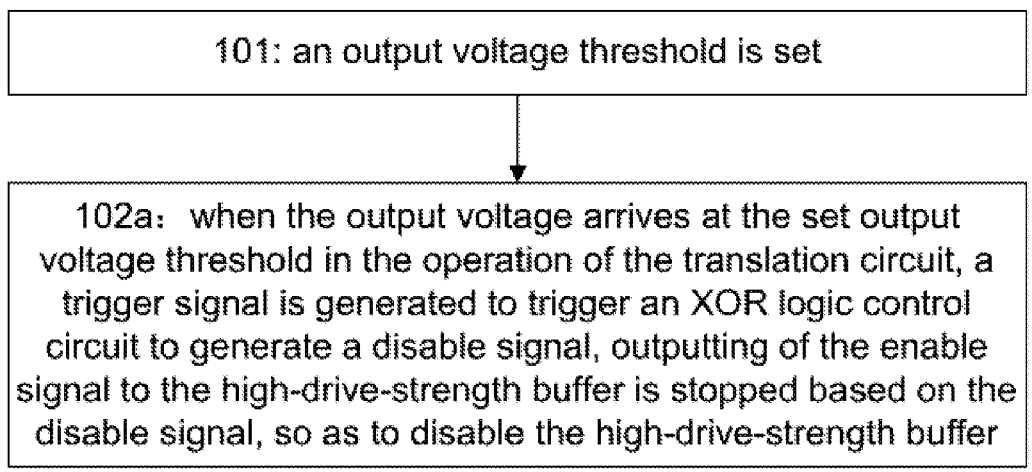
FIG. 10 is a flow chart showing a second output control method according to the present disclosure.

The specific operations of the step are shown in Step 102a in FIG. 10. When the translation circuit is operating, the output voltage is detected, and the output voltage is compared with the set output voltage threshold, and when the output voltage arrives at the set output voltage threshold, a trigger signal is generated, the trigger signal triggers an XOR logic control circuit to generate the disable signal, outputting of the enable signal to a high-drive-strength buffer is stopped based on the disable signal, to disable the high-drive-strength buffer.

Figure 11:
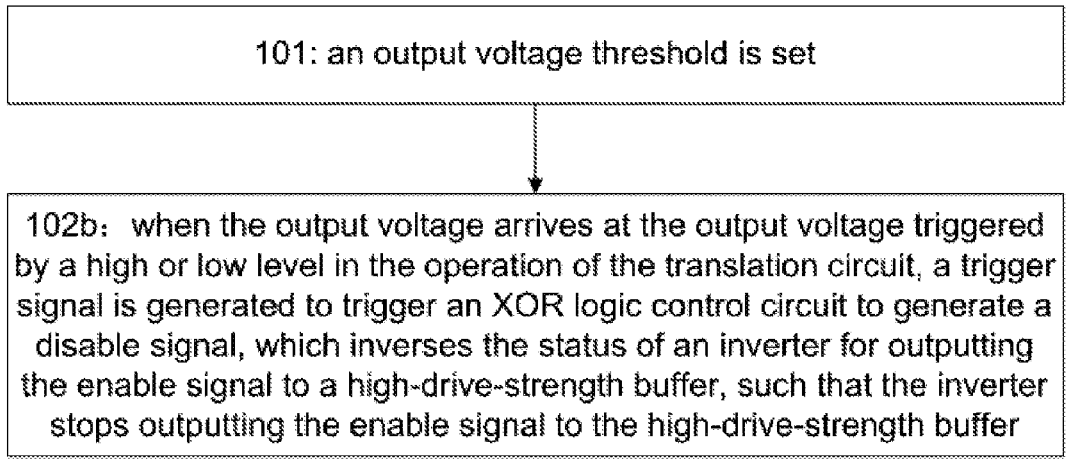
FIG. 11 is a flow chart showing a third output control method according to the present disclosure.

For example, as shown in Step 102b in FIG. 11, when the translation circuit is operating, the output voltage is detected, and the output voltage is compared with the set output voltage threshold, and when the output voltage arrives at the high or low voltage threshold, a trigger signal is generated, the trigger signal triggers an XOR logic control circuit to generate the disable signal, the disable signal inverses a status of an inverter for outputting the enable signal to a high-drive-strength buffer, such that the inverter stops outputting the enable signal to the high-drive-strength buffer.

Figure 12:
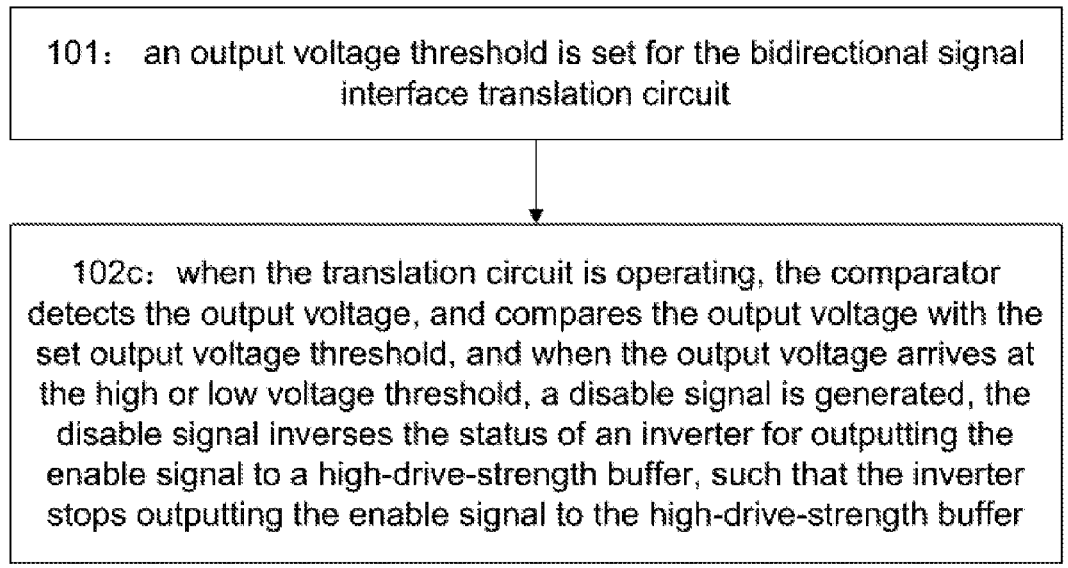
FIG. 12 is a flow chart showing a fourth output control method according to the present disclosure.

In practice, as shown in FIG. 12, Step 102 may be specifically implemented as Step 102c. When the translation circuit is operating, the comparator detects the output voltage, and compares the output voltage with the set output voltage threshold, and when the output voltage arrives at the high or low voltage threshold, a disable signal is generated, the disable signal inverses a status of an inverter for outputting the enable signal to a high-drive-strength buffer, such that the inverter stops outputting the enable signal to the high-drive-strength buffer.

Based on the output control circuit as shown in FIG. 2, the present disclosure also provides a translation circuit, which includes an input buffer, a high-strength-drive buffer and an output control circuit, wherein the input buffer outputs an input signal to the output control circuit, and the output control circuit controls an output signal of the high-strength-drive buffer.

As shown in FIG. 2, the output control circuit includes the edge detector 21, the signal feedback circuit 22 and the enable control circuit 23.

The edge detector 21 is configured to trigger the signal feedback circuit 22 and the enable control circuit 23 upon detection of the input signal.

The signal feedback circuit 22 is configured to detect an output voltage, to compare the output voltage with a set output voltage threshold, and to output a disable signal to the enable control circuit 23 when the output voltage arrives at the set output voltage threshold.

The enable control circuit 23 is configured to stop an operation of the translation circuit, upon reception of the disable signal from the signal feedback circuit 22.

As shown in FIG. 3, in the edge detector 21, the input signal in is coupled to the input pin A, the inverting input signal inb is coupled to the inverting input pin Ab, the unidirectional operation signal edoe is coupled to the enable pin OE, the input goodness signal oe is coupled to the input goodness pin ingood, the input power node pwri is coupled to the input power pin pwrpin, the common ground node pwrn is coupled to the common ground pin pwrn, the output power pin pwrpout is coupled to the output power node pwro. When all of the input signal in, the inverting input signal inb, the input goodness signal oe, the unidirectional operation signal edoe, the input power node pwri, the common power node pwrn meet the operation requirements, the EDI is transmitted via the pin E and the EDO is transmitted via the pin ED. The output of the input buffer is coupled to the input pin A of the edge detector 31.

As shown in FIG. 4, the signal feedback circuit 22 specifically includes a threshold detection circuit 221 and a disable signal generation circuit 222, wherein the threshold detection circuit 221 is configured to detect an output voltage, to compare the output voltage with a set output voltage threshold, and to output a trigger signal to the disable signal generation circuit when the output voltage arrives at the output voltage threshold.

As shown in FIG. 4, a Schmitt input buffer may be used as the threshold detection circuit 221. The input pin (in) of the Schmitt input buffer is coupled to the output (out), the output pin (out1) and the inverting output pin (out1b) are coupled to the disable signal generation circuit 222, the output power node is pwro and the common ground node is pwrn. In the Schmitt input buffer, the high voltage threshold is set as ViH and/or the low voltage threshold is set as ViL. When the output voltage at the output arrives at ViH, a high level is output at the out1, and a low level is output at the out1b. Alternatively, when the output voltage at the output arrives at ViL, a low level is output at the out1, and a high level is output at the out1b.

The internal logic circuit of the Schmitt input buffer is shown in FIG. 5, in which the output power node is shown as pwro and the common ground node is shown as pwrn. When the output voltage at the output arrives at ViH, i.e., the set high voltage threshold, the high level occurs at the in. At this time, the PMOS M17, PMOS M18, PMOS M20, PMOS M22 and the NMOS M25 and NMOS M27 are turned off, and the PMOS M19, PMOS M21, NMOS M23, NMOS M24, NMOS M26, NMOS M28 are turned on, such that the high level is output at the out1 and the low level is output at the out1b.

When the output voltage at the output arrives at ViL, i.e., the set low voltage threshold, the low level occurs at the in. At this time, the PMOS M17, PMOS M18, PMOS M20, PMOS M22 and the NMOS M25 and NMOS M27 are turned on, and the PMOS M19, PMOS M21, NMOS M23, NMOS M24, NMOS M26, NMOS M28 are turned off, such that the low level is output at the out1 and the high level is output at the out1b.

The disable signal generation circuit 222 is configured to output a disable signal to the enable control circuit 23 upon reception of the trigger signal from the threshold detection circuit 221.

As shown in FIG. 4, in the disable signal generation circuit 222, an XOR logic control circuit is used to control the generation of the disable signal. Specifically, when the out1 is at the high level and the out1b is at the low level, the NMOS M5 and the NMOS M6 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. When the out1 is at the low level and the out1b is at the high level, the NMOS M7 and the NMOS M8 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. Here, the gates of the PMOS M4 and the NMOS M6 are coupled to the input signal (ino) at the output and the levels of the gates are identical to that at the out1. The gates of the PMOS M2 and NMOS M8 are coupled to the inverting input signal (inbo) at the output and the levels of the gates are identical to that at the out1b. The gate voltage of the PMOS M9 is EDO, which is at the high level in operation, such that the PMOS M9 is turned off.

The connection relations of the individual devices in the disable signal generation circuit 222 are described as follows. The gates of the PMOS M1 and MMOS M5 are coupled to the out1 of the threshold detection circuit 221. The gates of the PMOS M3 and MMOS M7 are coupled to the out1b of the threshold detection circuit 221. The source of the PMOS M1 is coupled to the drain of the PMOS M2. The drain of the PMOS M1 is coupled to the drains of the PMOS M3 and NMOS M5. The gate of the PMOS M2 is coupled to the inbo. The source of the PMOS M2 is coupled to the output power node pwro. The source of the PMOS M3 is coupled to the drain of the PMOS M4. The drain of the PMOS M3 is coupled to the drain of the NMOS M7. The gate of the PMOS M4 is coupled to the ino. The source of the PMOS M4 is coupled to the output power node pwro. The source of the NMOS M5 is coupled to the drain of the NMOS M6. The gate of the NMOS M6 is coupled to the ino. The source of the NMOS M6 is coupled to the common ground node pwrn. The source of the NMOS M7 is coupled to the drain of the NMOS M8. The gate of the NMOS M8 is coupled to the inbo. The source of the NMOS M8 is coupled to the common ground node pwrn. The gate of the PMOS M9 is coupled to the EDO. The source of the PMOS M9 is coupled to the common ground node pwrn. The drain of the PMOS M9 is coupled to the source of the PMOS M10. The gate of the PMOS M10 is coupled to the drains of the PMOS M3 and NMOS M7. The drain of the PMOS M10 forms the node latch_P for transmitting the disable signal.

The enable control circuit 23 is specifically configured to stop outputting the enable signal to the high-drive-strength buffer based on the disable signal, in order to disable the high-drive-strength buffer, where the high-drive-strength buffer is a buffer having a strong drive capability and is configured to output a drive signal upon reception of the enable signal, such that the output voltage at the output arrives at a desired voltage value of the logic level, and to stop outputting the drive signal upon reception of the disable signal.

In practice, the signal feedback circuit 22 may be implemented as a comparator. In this case, the signal feedback circuit 22 may be implemented as a high voltage signal feedback circuit and a low voltage signal feedback circuit.

The high voltage signal feedback circuit is configured to detect an output voltage, to compare the output voltage with a set output voltage threshold, and to output a disable signal to the enable control circuit 23 when the output voltage arrives at a set high voltage threshold.

The low voltage signal feedback circuit is configured to detect an output voltage, to compare the output voltage with a set output voltage threshold, and to output a disable signal to the enable control circuit 23 when the output voltage arrives at a set low voltage threshold.

The internal structure of the high voltage signal feedback circuit is shown in FIG. 6, in which the output power node pwro is coupled to the source of the PMOS M29. When the enable control circuit 23 outputs an enable signal (enable), and the input signal at the input is high, the switch S1 is turned on, and the high voltage signal feedback circuit begins to operate. When the voltage at the output out arrives at ViH, the NMOS M32 is turned on, which further sets the voltage of the node latch_n to be low, such that a disable signal which indicates the low voltage of the node latch_n, is transmitted to the enable control circuit 23. ViH=ViH_REF+Iref 1*RH, where ViH_REF indicates the voltage value of the node coupled to the gate and drain of the PMOS 29 and the source of the PMOS 30, Iref 1 indicates the current value of the first reference current source Iref 1 and RH indicates the resistance of the resistor at the source of the PMOS M31.

The low voltage signal feedback circuit is shown in FIG. 7, in which the output power node pwro is coupled to the switch S2. When the enable control circuit 23 outputs an enable signal (enable), and the input signal at the input is low, the switch S2 is turned on, and the low voltage signal feedback circuit begins to operate. When the voltage at the output arrives at ViL, the PMOS M36 is turned on, which further sets the voltage of the node latch_p to be high, such that a disable signal which indicates the high voltage of the node latch_p, is transmitted to the enable control circuit 23. ViL=ViL_REF−Iref 2*RL, where ViL_REF indicates the voltage value of the node coupled to the source of the NMOS 33 and the gate and the drain of the NMOS 34, Iref 2 indicates the current value of the second reference current source Iref 2 and RL indicates the resistance of the resistor at the source of the NMOS M35.

As shown in FIG. 8, when the enable control circuit 23 is operating, the EDO turns on the NMOS M14, and sets the voltage of the node latch_p to be low, the inverter OP1 outputs an enable signal (enable), which corresponds to the HDS$_A$ or HDS$_B$ signal generated at the bidirectional signal interface as shown in FIG. 1. When the disable signal generation circuit 222 or the low voltage signal feedback circuit sets the voltage of the node latch_p to be high, or the high voltage signal feedback circuit set the voltage of the node latch_n to be low, causing the PMOS M11 to be turned on, such that the voltage of the node latch_p is set to be high, the inverter OP1 is inversed to stop outputting the enable signal, which corresponds to stop outputting the HDS$_A$ or HDS$_B$ signal generated at the bidirectional signal interface as shown in FIG. 1, thus disabling the high-drive-strength buffer to output signals.

In FIG. 8, the PMOS M11, PMOS M12, NMOS M15 and NMOS M16 forms a latch, the output power node is shown as pwro, the common ground node is shown as pwrn and the input power node is shown as pwri.

The connection relations of the individual devices in the enable control circuit 23 are described as follows. The gate of the PMOS M11 is coupled to the gate of the NMOS M15. The source of the PMOS M11 is coupled to the output power node pwro. The drain of the PMOS M11 is coupled to the node latch_P in the signal feedback circuit 22, the drain of the NMOS M14 and the drain of the NMOS M15. The gate of the PMOS M12 is coupled to the gate of the NMOS M16, the node latch_P in the signal feedback circuit 22 and the input of the inverter OP1. The source of the PMOS M12 is coupled to the output power node pwro. The drain of the PMOS M12 is coupled to the gate of the NMOS M15 and the drain of the NMOS M16. The gate of the NMOS M14 is coupled to the EDO. The source of the NMOS M14 is coupled to the common ground node pwrn. The source of the NMOS M15 is coupled to the common ground node pwrn. The gate of the NMOS M16 is coupled to the input of the inverter OP1. The source of the NMOS M16 is coupled to the common ground node pwrn.

The enable control circuit 23 is further configured to set the voltage of the node latch_p to be low through the EDI, such that the inverter OP1 outputs the enable signal to the high-drive-strength buffer. In this way, the operation delay for the translation circuit may be reduced. As shown in FIG. 8, the EDI occurs as long as there is an input signal. The EDI turns on the NMOS M13 and sets the voltage of the node latch_p to be low in a shortest period.

The enable control circuit 23 is further configured to output a unidirectional operation signal to the edge detector 21 upon detecting that the translation circuit is operating unidirectionally. As shown in FIG. 8, assuming that the unidirectional operation signal edoe of the high level indicates that the reversed translation circuit is not operating, when the signal edoeb is at the low level in the case that the inversed translation circuit is not operating, the unidirectional operation signal edoe of the high level may be obtained via the inverter OP2. The edge detector triggers the signal feedback circuit and the enable control circuit when the edoe is at the high level.

Based on the output control circuit as shown in FIG. 2, the present disclosure also provides a bidirectional signal interface, which includes two or more output control circuits as shown in FIG. 2, for controlling high-drive-strength buffers in a first, second, . . . Nth translation circuit respectively, wherein N is a positive integer larger than 1, and refers to the number of the translation circuits.

As shown in FIG. 2, the output control circuit includes a signal feedback circuit 22 and an enable control circuit 23.

The signal feedback circuit 22 is configured to detect an output voltage, to compare the output voltage with a set output voltage threshold of a bidirectional signal interface translation circuit, and to output a disable signal to the enable control circuit 23 when the output voltage arrives at the set output voltage threshold.

The enable control circuit 23 is configured to stop an operation of the translation circuit, upon reception of the disable signal from the signal feedback circuit 22.

The output control circuit may further include an edge detector 21, configured to trigger the signal feedback circuit 22 and the enable control circuit 23 upon detection of an input signal.

As shown in FIG. 3, in the edge detector 21, the input signal in is coupled to the input pin A, the inverting input signal inb is coupled to the inverting input pin Ab, the unidirectional operation signal edoe is coupled to the enable pin OE, the input goodness signal oe is coupled to the input goodness pin ingood, the input power node pwri is coupled to the input power pin pwrpin, the common ground node pwrn is coupled to the common ground pin pwrn, the output power pin pwrpout is coupled to the output power node pwro. When all of the input signal in, the inverting input signal inb, the input goodness signal oe, the unidirectional operation signal edoe, the input power node pwri, the common power node pwrn meet the operation requirements, the EDI is transmitted via the pin E and the EDO is transmitted via the pin ED.

As shown in FIG. 4, the signal feedback circuit 22 specifically includes a threshold detection circuit 221 and a disable signal generation circuit 222, wherein the threshold detection circuit 221 is configured to detect an output voltage, to compare the output voltage with a set output voltage threshold, and to output a trigger signal to the disable signal generation circuit when the output voltage arrives at the output voltage threshold.

As shown in FIG. 4, a Schmitt input buffer may be used as the threshold detection circuit 221. The input pin (in) of the Schmitt input buffer is coupled to the output (out), the output pin (out1) and the inverting output pin (out1b) are coupled to the disable signal generation circuit 222, the output power node is pwro and the common ground node is pwrn. In the Schmitt input buffer, the high voltage threshold is set as ViH and/or the low voltage threshold is set as ViL. When the output voltage at the output arrives at ViH, a high level is output at the out1, and a low level is output at the out1b. Alternatively, when the output voltage at the output arrives at ViL, a low level is output at the out1, and a high level is output at the out1b.

The internal logic circuit of the Schmitt input buffer is shown in FIG. 5, in which the output power node is shown as pwro and the common ground node is shown as pwrn. When the output voltage at the output arrives at ViH, i.e., the set high voltage threshold, the high level occurs at the in. At this time, the PMOS M17, PMOS M18, PMOS M20, PMOS M22 and the NMOS M25 and NMOS M27 are turned off, and the PMOS M19, PMOS M21, NMOS M23, NMOS M24, NMOS M26, NMOS M28 are turned on, such that the high level is output at the out1 and the low level is output at the out1b.

When the output voltage at the output arrives at ViL, i.e., the set low voltage threshold, the low level occurs at the in. At this time, the PMOS M17, PMOS M18, PMOS M20, PMOS M22 and the NMOS M25 and NMOS M27 are turned on, and the PMOS M19, PMOS M21, NMOS M23, NMOS M24, NMOS M26, NMOS M28 are turned off, such that the low level is output at the out1 and the high level is output at the out1b.

The disable signal generation circuit 222 is configured to output a disable signal to the enable control circuit 23 upon reception of the trigger signal from the threshold detection circuit 221.

As shown in FIG. 4, in the disable signal generation circuit 222, an XOR logic control circuit is used to control the generation of the disable signal. Specifically, when the out1 is at the high level and the out1b is at the low level, the NMOS M5 and the NMOS M6 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. When the out1 is at the low level and the out1b is at the high level, the NMOS M7 and the NMOS M8 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. Here, the gates of the PMOS M4 and the NMOS M6 are coupled to the input signal (ino) at the input and the levels of the gates are identical to that at the out1. The gates of the PMOS M2 and the NMOS M8 are coupled to the inverting input signal (inbo) at the output and the levels of the gates are identical to that at the out1b. The gate voltage of the PMOS M9 is EDO, which is at the high level in operation, such that the PMOS M9 is turned off.

The connection relations of the individual devices in the disable signal generation circuit 222 are described as follows. The gates of the PMOS M1 and MMOS M5 are coupled to the out1 of the threshold detection circuit 221. The gates of the PMOS M3 and MMOS M7 are coupled to the out1b of the threshold detection circuit 221. The source of the PMOS M1 is coupled to the drain of the PMOS M2. The drain of the PMOS M1 is coupled to the drains of the PMOS M3 and NMOS M5. The gate of the PMOS M2 is coupled to the inbo. The source of the PMOS M2 is coupled to the output power node pwro. The source of the PMOS M3 is coupled to the drain of the PMOS M4. The drain of the PMOS M3 is coupled to the drain of the NMOS M7. The gate of the PMOS M4 is coupled to the ino. The source of the PMOS M4 is coupled to the output power node pwro. The source of the NMOS M5 is coupled to the drain of the NMOS M6. The gate of the NMOS M6 is coupled to the ino. The source of the NMOS M6 is coupled to the common ground node pwrn. The source of the NMOS M7 is coupled to the drain of the NMOS M8. The gate of the NMOS M8 is coupled to the inbo. The source of the NMOS M8 is coupled to the common ground node pwrn. The gate of the PMOS M9 is coupled to the EDO. The source of the PMOS M9 is coupled to the common ground node pwrn. The drain of the PMOS M9 is coupled to the source of the PMOS M10. The gate of the PMOS M10 is coupled to the drains of the PMOS M3 and NMOS M7. The drain of the PMOS M10 forms the node latch_P for transmitting the disable signal.

The enable control circuit 23 is specifically configured to stop outputting the enable signal to the high-drive-strength buffer based on the disable signal, in order to disable the high-drive-strength buffer, where the high-drive-strength buffer is a buffer having a strong drive capability and is configured to output a drive signal upon reception of the enable signal, such that the output voltage at the output arrives at a desired voltage value of the logic level, and to stop outputting the drive signal upon reception of the disable signal.

In practice, the signal feedback circuit 22 may be implemented as a comparator. In this case, the signal feedback circuit 22 may be implemented as a high voltage signal feedback circuit and a low voltage signal feedback circuit.

The high voltage signal feedback circuit is configured to detect an output voltage, to compare the output voltage with a set output voltage threshold, and to output a disable signal to the enable control circuit 23 when the output voltage arrives at a set high voltage threshold.

The low voltage signal feedback circuit is configured to detect an output voltage, to compare the output voltage with a set output voltage threshold, and to output a disable signal to the enable control circuit 23 when the output voltage arrives at a set low voltage threshold.

The internal structure of the high voltage signal feedback circuit is shown in FIG. 6, in which the output power node pwro is coupled to the source of the PMOS M29. When the enable control circuit 23 outputs an enable signal (enable), and the input signal at the input is high, the switch S1 is turned on, and the high voltage signal feedback circuit begins to operate. When the voltage at the output out arrives at ViH, the NMOS M32 is turned on, which further sets the voltage of the node latch_n to be low, such that a disable signal which indicates the low voltage of the node latch_n, is transmitted to the enable control circuit 23. $ViH = ViH\_REF + Iref\,1 * RH$, where ViH_REF indicates the voltage value of the node coupled to the gate and drain of the PMOS 29 and the source of the PMOS 30, Iref 1 indicates the current value of the first reference current source Iref 1 and RH indicates the resistance of the resistor at the source of the PMOS M31.

The low voltage signal feedback circuit is shown in FIG. 7, in which the output power node pwro is coupled to the switch S2. When the enable control circuit 23 outputs an enable signal (enable), and the input signal at the input is low, the switch S2 is turned on, and the low voltage signal feedback circuit begins to operate. When the voltage at the output arrives at ViL, the PMOS M36 is turned on, which further sets the voltage of the node latch_p to be high, such that a disable signal which indicates the high voltage of the node latch_p, is transmitted to the enable control circuit 23. $ViL = ViL\_REF - Iref\,2 * RL$, where ViL_REF indicates the voltage value of the node coupled to the source of the NMOS 33 and the gate and the drain of the NMOS 34, Iref 2 indicates the current value of the second reference current source Iref 2 and RL indicates the resistance of the resistor at the source of the NMOS M35.

As shown in FIG. 8, when the enable control circuit 23 is operating, the EDO turns on the NMOS M14, and sets the voltage of the node latch_p to be low, the inverter OP1 outputs an enable signal (enable), which corresponds to the $HDS_A$ or $HDS_B$ signal generated at the bidirectional signal interface as shown in FIG. 1. When the disable signal generation circuit 222 or the low voltage signal feedback circuit sets the voltage of the node latch_p to be high, or the high voltage signal feedback circuit set the voltage of the node latch_n to be low, causing the PMOS M11 to be turned on, such that the voltage of the node latch_p is set to be high, the inverter OP1 is inversed to stop outputting the enable signal, which corresponds to stop outputting the $HDS_A$ or $HDS_B$ signal generated at the bidirectional signal interface as shown in FIG. 1, thus disabling the high-drive-strength buffer to output signals.

In FIG. 8, the PMOS M11, PMOS M12, NMOS M15 and NMOS M16 forms a latch, the output power node is shown as pwro, the common ground node is shown as pwrn and the input power node is shown as pwri.

The connection relations of the individual devices in the enable control circuit 23 are described as follows. The gate of the PMOS M11 is coupled to the gate of the NMOS M15. The source of the PMOS M11 is coupled to the output power node pwro. The drain of the PMOS M11 is coupled to the node latch_P in the signal feedback circuit 22, the drain of the NMOS M14 and the drain of the NMOS M15. The gate of the PMOS M12 is coupled to the gate of the NMOS M16, the node latch_P in the signal feedback circuit 22 and the input of the inverter OP1. The source of the PMOS M12 is coupled to the output power node pwro. The drain of the PMOS M12 is coupled to the gate of the NMOS M15 and the drain of the NMOS M16. The gate of the NMOS M14 is coupled to the EDO. The source of the NMOS M14 is coupled to the common ground node pwrn. The source of the NMOS M15 is coupled to the common ground node pwrn. The gate of the NMOS M16 is coupled to the input of the inverter OP1. The source of the NMOS M16 is coupled to the common ground node pwrn.

The enable control circuit 23 is further configured to set the voltage of the node latch_p to be low through the EDI, such that the inverter OP1 outputs the enable signal to the high-drive-strength buffer. In this way, the operation delay for the translation circuit may be reduced. As shown in FIG. 8, the EDI occurs as long as there is an input signal. The EDI turns on the NMOS M13 and sets the voltage of the node latch_p to be low in a shortest period.

The enable control circuit 23 is further configured to output a unidirectional operation signal to the edge detector 21 upon detecting that the translation circuit is operating unidirectionally. As shown in FIG. 8, assuming that the unidirectional operation signal edoe of the high level indicates that the reversed translation circuit is not operating, when the signal edoeb is at the low level in the case that the inversed translation circuit is not operating, the unidirectional operation signal edoe of the high level may be obtained via the inverter OP2. The edge detector triggers the signal feedback circuit and the enable control circuit when the edoe is at the high level.

Based on the bidirectional signal interface as described above, the present disclosure also provides an electronic apparatus, which includes a master circuit, a slave circuit and a bidirectional signal interface, wherein the bidirectional signal interface includes two or more output control circuits as described above.

As shown in FIG. 2, the output control circuit includes a signal feedback circuit 22 and an enable control circuit 23.

The signal feedback circuit 22 is configured to detect an output voltage, to compare the output voltage with a set output voltage threshold of a bidirectional signal interface translation circuit, and to output a disable signal to the enable control circuit 23 when the output voltage arrives at the set output voltage threshold.

The enable control circuit 23 is configured to stop an operation of the translation circuit, upon reception of the disable signal from the signal feedback circuit 22.

The output control circuit may further include an edge detector 21, configured to trigger the signal feedback circuit 22 and the enable control circuit 23 upon detection of an input signal.

As shown in FIG. 3, in the edge detector 21, the input signal in is coupled to the input pin A, the inverting input signal inb is coupled to the inverting input pin Ab, the unidirectional operation signal edoe is coupled to the enable pin OE, the input goodness signal oe is coupled to the input goodness pin ingood, the input power node pwri is coupled to the input power pin pwrpin, the common ground node pwrn is coupled to the common ground pin pwrn, the output power pin pwrpout is coupled to the output power node pwro. When all of the input signal in, the inverting input signal inb, the input goodness signal oe, the unidirectional operation signal edoe, the input power node pwri, the common power node pwrn meet the operation requirements, the EDI is transmitted via the pin E and the EDO is transmitted via the pin ED.

As shown in FIG. 4, the signal feedback circuit 22 specifically includes a threshold detection circuit 221 and a disable signal generation circuit 222, wherein the threshold detection circuit 221 is configured to detect an output voltage, to compare the output voltage with a set output voltage threshold, and to output a trigger signal to the disable signal generation circuit when the output voltage arrives at the output voltage threshold.

As shown in FIG. 4, a Schmitt input buffer may be used as the threshold detection circuit 221. The input pin (in) of the Schmitt input buffer is coupled to the output (out), the output pin (out1) and the inverting output pin (out1b) are coupled to the disable signal generation circuit 222, the output power node is pwro and the common ground node is pwrn. In the Schmitt input buffer, the high voltage threshold is set as ViH and/or the low voltage threshold is set as ViL. When the output voltage at the output arrives at ViH, a high level is output at the out1, and a low level is output at the out1b. Alternatively, when the output voltage at the output arrives at ViL, a low level is output at the out1, and a high level is output at the out1b.

The internal logic circuit of the Schmitt input buffer is shown in FIG. 5, in which the output power node is shown as pwro and the common ground node is shown as pwrn. When the output voltage at the output arrives at ViH, i.e., the set high voltage threshold, the high level occurs at the in. At this time, the PMOS M17, PMOS M18, PMOS M20, PMOS M22 and the NMOS M25 and NMOS M27 are turned off, and the PMOS M19, PMOS M21, NMOS M23, NMOS M24, NMOS M26, NMOS M28 are turned on, such that the high level is output at the out1 and the low level is output at the out1b.

When the output voltage at the output arrives at ViL, i.e., the set low voltage threshold, the low level occurs at the in. At this time, the PMOS M17, PMOS M18, PMOS M20, PMOS M22 and the NMOS M25 and NMOS M27 are turned on, and the PMOS M19, PMOS M21, NMOS M23, NMOS M24, NMOS M26, NMOS M28 are turned off, such that the low level is output at the out1 and the high level is output at the out1b.

The disable signal generation circuit 222 is configured to output a disable signal to the enable control circuit 23 upon reception of the trigger signal from the threshold detection circuit 221.

As shown in FIG. 4, in the disable signal generation circuit 222, an XOR logic control circuit is used to control the generation of the disable signal. Specifically, when the out1 is at the high level and the out1$b$ is at the low level, the NMOS M5 and the NMOS M6 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. When the out1 is at the low level and the out1$b$ is at the high level, the NMOS M7 and the NMOS M8 are turned on, such that the gate voltage of the PMOS M10 is set to be low, which turns on the PMOS M10, and thus the voltage at the node latch_p is set to be high, the voltage of the node latch_p which is set to be high is the disable signal sent to the enable control circuit 23. Here, the gates of the PMOS M4 and the NMOS M6 are coupled to the input signal (ino) at the output and the levels of the gates are identical to that at the out1. The gates of the PMOS M2 and NMOS M8 are coupled to the inverting input signal (inbo) at the output and the levels of the gates are identical to that at the out1$b$. The gate voltage of the PMOS M9 is EDO, which is at the high level in operation, such that the PMOS M9 is turned off.

The connection relations of the individual devices in the disable signal generation circuit 222 are described as follows. The gates of the PMOS M1 and MMOS M5 are coupled to the out1 of the threshold detection circuit 221. The gates of the PMOS M3 and MMOS M7 are coupled to the out1$b$ of the threshold detection circuit 221. The source of the PMOS M1 is coupled to the drain of the PMOS M2. The drain of the PMOS M1 is coupled to the drains of the PMOS M3 and NMOS M5. The gate of the PMOS M2 is coupled to the inbo. The source of the PMOS M2 is coupled to the output power node pwro. The source of the PMOS M3 is coupled to the drain of the PMOS M4. The drain of the PMOS M3 is coupled to the drain of the NMOS M7. The gate of the PMOS M4 is coupled to the ino. The source of the PMOS M4 is coupled to the output power node pwro. The source of the NMOS M5 is coupled to the drain of the NMOS M6. The gate of the NMOS M6 is coupled to the ino. The source of the NMOS M6 is coupled to the common ground node pwrn. The source of the NMOS M7 is coupled to the drain of the NMOS M8. The gate of the NMOS M8 is coupled to the inbo. The source of the NMOS M8 is coupled to the common ground node pwrn. The gate of the PMOS M9 is coupled to the EDO. The source of the PMOS M9 is coupled to the common ground node pwrn. The drain of the PMOS M9 is coupled to the source of the PMOS M10. The gate of the PMOS M10 is coupled to the drains of the PMOS M3 and NMOS M7. The drain of the PMOS M10 forms the node latch_P for transmitting the disable signal.

The enable control circuit 23 is specifically configured to stop outputting the enable signal to the high-drive-strength buffer based on the disable signal, in order to disable the high-drive-strength buffer, where the high-drive-strength buffer is a buffer having a strong drive capability and is configured to output a drive signal upon reception of the enable signal, such that the output voltage at the output arrives at a desired voltage value of the logic level, and to stop outputting the drive signal upon reception of the disable signal.

In practice, the signal feedback circuit 22 may be implemented as a comparator. In this case, the signal feedback circuit 22 may be implemented as a high voltage signal feedback circuit and a low voltage signal feedback circuit.

The high voltage signal feedback circuit is configured to detect an output voltage, to compare the output voltage with a set output voltage threshold, and to output a disable signal to the enable control circuit 23 when the output voltage arrives at a set high voltage threshold.

The low voltage signal feedback circuit is configured to detect an output voltage, to compare the output voltage with a set output voltage threshold, and to output a disable signal to the enable control circuit 23 when the output voltage arrives at a set low voltage threshold.

The internal structure of the high voltage signal feedback circuit is shown in FIG. 6, in which the output power node pwro is coupled to the source of the PMOS M29. When the enable control circuit 23 outputs an enable signal (enable), and the input signal at the input is high, the switch S1 is turned on, and the high voltage signal feedback circuit begins to operate. When the voltage at the output out arrives at ViH, the NMOS M32 is turned on, which further sets the voltage of the node latch_n to be low, such that a disable signal which indicates the low voltage of the node latch_n, is transmitted to the enable control circuit 23. ViH=ViH_REF+Iref 1*RH, where ViH_REF indicates the voltage value of the node coupled to the gate and drain of the PMOS 29 and the source of the PMOS 30, Iref 1 indicates the current value of the first reference current source Iref 1 and RH indicates the resistance of the resistor at the source of the PMOS M31.

The low voltage signal feedback circuit is shown in FIG. 7, in which the output power node pwro is coupled to the switch S2. When the enable control circuit 23 outputs an enable signal (enable), and the input signal at the input is low, the switch S2 is turned on, and the low voltage signal feedback circuit begins to operate. When the voltage at the output arrives at ViL, the PMOS M36 is turned on, which further sets the voltage of the node latch_p to be high, such that a disable signal which indicates the high voltage of the node latch_p, is transmitted to the enable control circuit 23. ViL=ViL_REF−Iref 2*RL, where ViL_REF indicates the voltage value of the node coupled to the source of the NMOS 33 and the gate and the drain of the NMOS 34, Iref 2 indicates the current value of the second reference current source Iref 2 and RL indicates the resistance of the resistor at the source of the NMOS M35.

As shown in FIG. 8, when the enable control circuit 23 is operating, the EDO turns on the NMOS M14, and sets the voltage of the node latch_p to be low, the inverter OP1 outputs an enable signal (enable), which corresponds to the $HDS_A$ or $HDS_B$ signal generated at the bidirectional signal interface as shown in FIG. 1. When the disable signal generation circuit 222 or the low voltage signal feedback circuit sets the voltage of the node latch_p to be high, or the high voltage signal feedback circuit set the voltage of the node latch_n to be low, causing the PMOS M11 to be turned on, such that the voltage of the node latch_p is set to be high, the inverter OP1 is inversed to stop outputting the enable signal, which corresponds to stop outputting the $HDS_A$ or $HDS_B$ signal generated at the bidirectional signal interface as shown in FIG. 1, thus disabling the high-drive-strength buffer to output signals.

In FIG. 8, the PMOS M11, PMOS M12, NMOS M15 and NMOS M16 forms a latch, the output power node is shown as pwro, the common ground node is shown as pwrn and the input power node is shown as pwri.

The connection relations of the individual devices in the enable control circuit 23 are described as follows. The gate of the PMOS M11 is coupled to the gate of the NMOS M15. The source of the PMOS M11 is coupled to the output power node pwro. The drain of the PMOS M11 is coupled to the node latch_P in the signal feedback circuit 22, the drain of the NMOS M14 and the drain of the NMOS M15. The gate of the PMOS M12 is coupled to the gate of the NMOS M16, the node latch_P in the signal feedback circuit 22 and the input of the inverter OP1. The source of the PMOS M12 is coupled to the output power node pwro. The drain of the PMOS M12 is coupled to the gate of the NMOS M15 and the drain of the NMOS M16. The gate of the NMOS M14 is coupled to the EDO. The source of the NMOS M14 is coupled to the common ground node pwrn. The source of the NMOS M15 is coupled to the common ground node pwrn. The gate of the NMOS M16 is coupled to the input of the inverter OP1. The source of the NMOS M16 is coupled to the common ground node pwrn.

The enable control circuit 23 is further configured to set the voltage of the node latch_p to be low through the EDI, such that the inverter OP1 outputs the enable signal to the high-drive-strength buffer. In this way, the operation delay for the translation circuit may be reduced. As shown in FIG. 8, the EDI occurs as long as there is an input signal. The EDI turns on the NMOS M13 and sets the voltage of the node latch_p to be low in a shortest period.

The enable control circuit 23 is further configured to output a unidirectional operation signal to the edge detector 21 upon detecting that the translation circuit is operating unidirectionally. As shown in FIG. 8, assuming that the unidirectional operation signal edoe of the high level indicates that the reversed translation circuit is not operating, when the signal edoeb is at the low level in the case that the inversed translation circuit is not operating, the unidirectional operation signal edoe of the high level may be obtained via the inverter OP2. The edge detector triggers the signal feedback circuit and the enable control circuit when the edoe is at the high level.

In practice, the master circuit may be a processor, and accordingly the slave circuit may be a memory.

The electronic apparatus may be a mobile phone, ipad, a notebook, and so on.

For further clarifying the technical effects resulted from the technical solutions of the present disclosure, a simulation experiment is performed on the technical solutions according to the present disclosure and the prior art, respectively. During the simulation experiment, the load capacitance at the output is 250 pF, the operating voltage of the output node B is 1.3V and the operating voltage of the input node A is 1.6V.

Figure 13A:
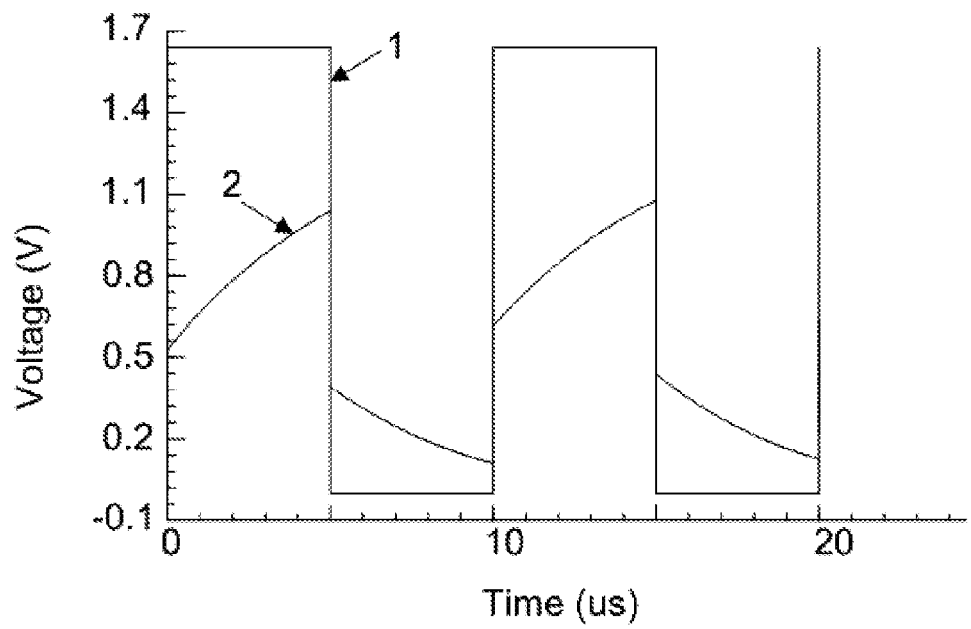
FIG. 13A is a simulation result chart of the technical solution according to the prior art.

FIG. 13A is a simulation result chart of the technical solution according to the prior art. As shown in FIG. 13A, curve 1 represents the operating voltage of the node A, and curve 2 represents the operating voltage of the node B. As can be seen from FIG. 13A, the output enable signal (enable) goes high upon detection of the rising edge of the input signal. However, as the pulse width of the output enable signal (enable) is fixed, the voltage of the node B can only be pulled up to 0.5V initially. Then, the voltage of the node B is slowly pulled up by the bus driver to about 1.1V at the time when the falling edge of the node A occurs.

Figure 13B:
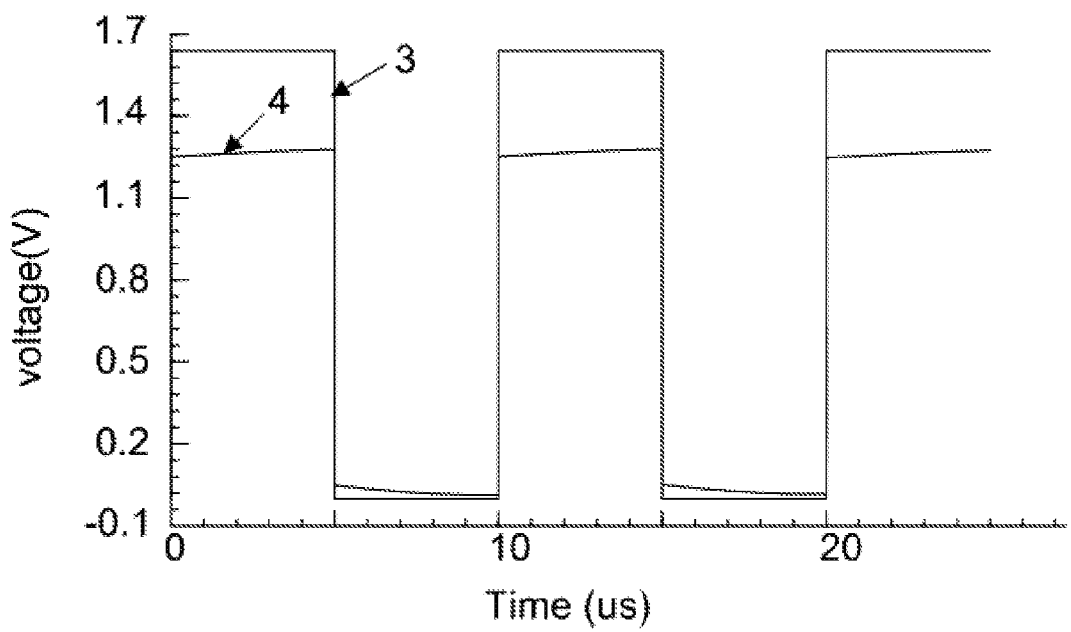
FIG. 13B is a simulation result chart of the technical solution according to the present disclosure.

FIG. 13B is a simulation result chart of the technical solution according to the present disclosure. As shown in FIG. 13B, curve 3 represents the operating voltage of the node A, and the curve 4 represents the operating voltage of the node B. As can be seen from FIG. 13B, when a rising edge of the input signal is detected, the output enable signal (enable) rises quickly, when the output control circuit detects that the voltage of the node B rises to ViH, i.e., 1.25V, the output control circuit stops outputting the enable signal, the bus driver keeps the voltage of the node B at about 1.25V before the falling edge of the node A.

As can be seen from the above experiment result, according to the existing technical solution, the voltage of the node B can only be pulled up to about 0.5V at the start point of the rising edge of the input signal, and there is still a large gap between the actual operating voltage of the node B and the desired operating voltage of the node B. However, according to the present disclosure, the voltage of the node B may arrive at the desired operating voltage at the start point of the rising edge of the input signal, thereby increasing the data transmission rate.

What are described above are just preferred embodiments of the present disclosure and are not intended to limit the scope of the present disclosure.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An output control circuit, comprising;
a signal feedback circuit;
an enable control circuit; and
an edge detector,
wherein the signal feedback circuit is configured to detect an output voltage, to compare the output voltage with a set output voltage threshold, and to output a disable signal to the enable control circuit when the output voltage arrives at the set output voltage threshold,
wherein the enable control circuit is configured to stop an operation of a translation circuit, upon reception of the disable signal from the signal feedback circuit, and
wherein the edge detector is configured to trigger the signal feedback circuit and the enable control circuit upon detection of an input signal.

2. The output control circuit according to claim 1, wherein the signal feedback circuit comprises a threshold detection circuit and a disable signal generation circuit,
wherein the threshold detection circuit is configured to detect the output voltage, to compare the output voltage with the set output voltage threshold, and to output a trigger signal to the disable signal generation circuit when the output voltage arrives at the output voltage threshold, and
wherein the disable signal generation circuit is configured to output the disable signal to the enable control circuit upon reception of the trigger signal from the threshold detection circuit.

3. The output control circuit according to claim 2, wherein the threshold detection circuit is implemented as a Schmitt input buffer.

4. The output control circuit according to claim 2, wherein the enable control circuit is specifically configured to stop outputting an enable signal to a high-drive-strength buffer based on the disable signal, in order to disable the high-drive-strength buffer.

5. The output control circuit according to claim 2, wherein the disable signal generation circuit is specifically configured to trigger an exclusive or (XOR) logic control circuit to generate the disable signal through the trigger signal.

6. The output control circuit according to claim 2, wherein the enable control circuit is specifically configured to inverse, based on the disable signal, a status of an inverter for outputting an enable signal to a high-drive-strength buffer, so as to stop outputting the enable signal to the high-drive-strength buffer.

7. The output control circuit according to claim 1, wherein the signal feedback circuit comprises a high voltage signal feedback circuit and a low voltage signal feedback circuit,
wherein the high voltage signal feedback circuit is configured to detect the output voltage, to compare the output voltage with the set output voltage threshold, and to output the disable signal to the enable control circuit when the output voltage arrives at a set high voltage threshold, and
wherein the low voltage signal feedback circuit is configured to detect the output voltage, to compare the output voltage with the set output voltage threshold, and to output the disable signal to the enable control circuit when the output voltage arrives at a set low voltage threshold.

8. The output control circuit according to claim 7, wherein each the high voltage signal feedback circuit and the low voltage signal feedback circuit is implemented as a comparator.

9. The output control circuit according to claim 1, wherein the enable control circuit is further configured to output an enable signal to a high-drive-strength buffer upon reception of an input enable signal.

10. The output control circuit according to claim 1, wherein the enable control circuit is further configured to output a unidirectional operation signal to the edge detector upon detecting that the translation circuit is operating unidirectionally, and
wherein the edge detector triggers the signal feedback circuit and the enable control circuit based on the unidirectional operation signal.

11. The output control circuit according to claim 2, wherein the output voltage threshold contains at least one of a high voltage threshold and a low voltage threshold.

12. An output control method, comprising:
detecting an output voltage when a translation circuit is operating;
comparing the output voltage with an output voltage threshold; and
outputting a disable signal to stop the operation of the translation circuit when the output voltage arrives at the set output voltage threshold, wherein outputting the disable signal includes:
generating a trigger signal when the output voltage arrives at the set output voltage threshold;
triggering an exclusive or (XOR) logic control circuit to generate the disable signal through the trigger signal; and
stopping outputting an enable signal to a high-drive-strength buffer based on the disable signal.

13. The output control method according to claim 12, wherein the output voltage threshold contains at least one of a high voltage threshold and a low voltage threshold.

14. The output control method according to claim 12, wherein generating a trigger signal includes generating the trigger signal when the output voltage arrives at a high or low output voltage threshold;

and
wherein stopping outputting an enable signal includes inversing a status of an inverter for outputting the enable signal to the high-drive-strength buffer by using the disable signal, such that the inverter stops outputting the enable signal to the high-drive-strength buffer.

15. The output control method according to claim 12, wherein outputting the disable signal to stop the operation of the translation circuit when the output voltage arrives at the set output voltage threshold comprises:
  detecting the output voltage and comparing the output voltage with the set output voltage threshold by using the comparator when the translation circuit is operating;
  wherein generating the disable signal includes generating the disable signal when the output voltage arrives at a set high or low output voltage threshold; and
  wherein stopping outputting an enable signal includes inversing a status of an inverter for outputting the enable signal to the high-drive-strength buffer by using the disable signal, such that the inverter stops outputting the enable signal to the high-drive-strength buffer.

16. A translation circuit, comprising:
  an input buffer;
  a high-strength-drive buffer; and
  an output control circuit,
  wherein the input buffer provides an input signal to the output control circuit, the output control circuit controls an output signal of the high-strength-drive buffer, and
  wherein the output control circuit comprises a signal feedback circuit, an enable control circuit and an edge detector, the edge detector is configured to trigger the signal feedback circuit and the enable control circuit upon detection of the input signal, the signal feedback circuit is configured to detect an output voltage, to compare the output voltage with a set output voltage threshold, and to output a disable signal to the enable control circuit when the output voltage arrives at the set output voltage threshold, and the enable control circuit is configured to stop an operation of a translation circuit, upon reception of the disable signal from the signal feedback circuit.

17. The translation circuit according to claim 16, wherein the signal feedback circuit comprises a threshold detection circuit and a disable signal generation circuit,
  wherein the threshold detection circuit is configured to detect the output voltage, to compare the output voltage with the set output voltage threshold, and to output a trigger signal to the disable signal generation circuit when the output voltage arrives at the output voltage threshold, and
  wherein the disable signal generation circuit is configured to output the disable signal to the enable control circuit upon reception of the trigger signal from the threshold detection circuit.

18. The translation circuit according to claim 17, wherein the threshold detection circuit is implemented as a Schmitt input buffer.

19. The translation circuit according to claim 17, wherein the enable control circuit is specifically configured to stop outputting an enable signal to the high-drive-strength buffer based on the disable signal, in order to disable the high-drive-strength buffer.

20. The translation circuit according to claim 17, wherein the disable signal generation circuit is specifically configured to trigger an exclusive or (XOR) logic control circuit to generate the disable signal through the trigger signal.

21. The translation circuit according to claim 17, wherein the enable control circuit is specifically configured to inverse, based on the disable signal, a status of an inverter for outputting an enable signal to the high-drive-strength buffer, so as to stop outputting the enable signal to the high-drive-strength buffer.

22. The translation circuit according to claim 16, wherein the signal feedback circuit comprises a high voltage signal feedback circuit and a low voltage signal feedback circuit,
  wherein the high voltage signal feedback circuit is configured to detect the output voltage, to compare the output voltage with the set output voltage threshold, and to output the disable signal to the enable control circuit when the output voltage arrives at a set high voltage threshold, and
  wherein the low voltage signal feedback circuit is configured to detect the output voltage, to compare the output voltage with the set output voltage threshold, and to output the disable signal to the enable control circuit when the output voltage arrives at a set low voltage threshold.

23. The translation circuit according to claim 22, wherein each the high voltage signal feedback circuit and the low voltage signal feedback circuit is implemented as a comparator.

24. The translation circuit according to claim 16, wherein the enable control circuit is further configured to output an enable signal to the high-drive-strength buffer upon reception of an input enable signal.

25. The translation circuit according to claim 16, wherein the enable control circuit is further configured to output a unidirectional operation signal to the edge detector upon detecting that the translation circuit is operating unidirectionally, and
  wherein the edge detector triggers the signal feedback circuit and the enable control circuit based on the unidirectional operation signal.

26. The translation circuit according to claim 16, wherein the output voltage threshold contains at least one of a high voltage threshold and a low voltage threshold.

27. A bidirectional signal interface, comprising:
  two or more output control circuits,
  wherein each of the output control circuits comprises a signal feedback circuit and an enable control circuit,
  wherein the signal feedback circuit is configured to detect an output voltage, to compare the output voltage with a set output voltage threshold of a bidirectional signal interface translation circuit, and to output a disable signal to the enable control circuit when the output voltage arrives at the set output voltage threshold, and
  wherein the enable control circuit is configured to stop an operation of the translation circuit, upon reception of the disable signal from the signal feedback circuit.

28. The bidirectional signal interface according to claim 27, wherein the output control circuit further comprises an edge detector, configured to trigger the signal feedback circuit and the enable control circuit upon detection of an input signal.

29. The bidirectional signal interface according to claim 27, wherein the signal feedback circuit comprises a threshold detection circuit and a disable signal generation circuit,
  wherein the threshold detection circuit is configured to detect the output voltage, to compare the output voltage with the set output voltage threshold, and to output a trigger signal to the disable signal generation circuit when the output voltage arrives at the output voltage threshold, and wherein the disable signal generation circuit is configured to output the disable signal to the enable control circuit upon reception of the trigger signal from the threshold detection circuit.

30. The bidirectional signal interface according to claim 29, wherein the threshold detection circuit is implemented as a Schmitt input buffer.

31. The bidirectional signal interface according to claim 29, wherein the enable control circuit is specifically configured to stop outputting an enable signal to a high-drive-strength buffer based on the disable signal, in order to disable the high-drive-strength buffer.

32. The bidirectional signal interface according to claim 29, wherein the disable signal generation circuit is specifically configured to trigger an exclusive or (XOR) logic control circuit to generate the disable signal through the trigger signal.

33. The bidirectional signal interface according to claim 29, wherein the enable control circuit is specifically configured to inverse, based on the disable signal, a status of an inverter for outputting an enable signal to a high-drive-strength buffer, so as to stop outputting the enable signal to the high-drive-strength buffer.

34. The bidirectional signal interface according to claim 27, wherein the signal feedback circuit comprises a high voltage signal feedback circuit and a low voltage signal feedback circuit,
   wherein the high voltage signal feedback circuit is configured to detect the output voltage, to compare the output voltage with the set output voltage threshold, and to output the disable signal to the enable control circuit when the output voltage arrives at a set high voltage threshold, and
   wherein the low voltage signal feedback circuit is configured to detect the output voltage, to compare the output voltage with the set output voltage threshold, and to output the disable signal to the enable control circuit when the output voltage arrives at a set low voltage threshold.

35. The bidirectional signal interface according to claim 34, wherein each of the high voltage signal feedback circuit and the low voltage signal feedback circuit is implemented as a comparator.

36. The bidirectional signal interface according to claim 27, wherein the enable control circuit is further configured to output an enable signal to a high-drive-strength buffer upon reception of an input enable signal.

37. The bidirectional signal interface according to claim 28, wherein the enable control circuit is further configured to output a unidirectional operation signal to the edge detector upon detecting that the translation circuit is operating unidirectionally, and
   wherein the edge detector triggers the signal feedback circuit and the enable control circuit based on the unidirectional operation signal.

38. The bidirectional signal interface according to claim 27, wherein the output voltage threshold contains at least one of a high voltage threshold and a low voltage threshold.

39. An electronic apparatus, comprising:
   a bidirectional signal interface including two or more output control circuits,
   wherein each of the output control circuits comprises a signal feedback circuit and an enable control circuit,
   wherein the signal feedback circuit is configured to detect an output voltage, to compare the output voltage with a set output voltage threshold of a bidirectional signal interface translation circuit, and to output a disable signal to the enable control circuit when the output voltage arrives at the set output voltage threshold, and
wherein the enable control circuit is configured to stop an operation of the translation circuit, upon reception of the disable signal from the signal feedback circuit.

* * * * *